(12) United States Patent
Kim

(10) Patent No.: US 9,841,460 B2
(45) Date of Patent: Dec. 12, 2017

(54) INTEGRATED CIRCUIT

(71) Applicant: SK hynix Inc., Icheon-si Gyeonggi-do (KR)

(72) Inventor: Ki Tae Kim, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 476 days.

(21) Appl. No.: 14/541,949

(22) Filed: Nov. 14, 2014

(65) Prior Publication Data

US 2016/0061886 A1    Mar. 3, 2016

(30) Foreign Application Priority Data

Aug. 28, 2014  (KR) .................. 10-2014-0113493

(51) Int. Cl.
  *G01R 31/28* (2006.01)
  *H01L 21/66* (2006.01)

(52) U.S. Cl.
  CPC .......... *G01R 31/2884* (2013.01); *H01L 22/32* (2013.01); *G01R 31/2896* (2013.01)

(58) Field of Classification Search
  None
  See application file for complete search history.

(56) References Cited

U.S. PATENT DOCUMENTS

| | | | | |
|---|---|---|---|---|
| 2008/0157076 A1* | 7/2008 | Jeong | .................. | G01R 31/2884 257/48 |
| 2011/0093235 A1* | 4/2011 | Oh | ..................... | G01R 31/2884 702/120 |
| 2011/0292708 A1* | 12/2011 | Kang | .................... | H01L 23/481 365/63 |
| 2012/0126840 A1* | 5/2012 | Lee | .................... | G11C 29/1201 324/750.3 |
| 2012/0272112 A1* | 10/2012 | Oh | ........................ | H01L 23/481 714/727 |
| 2012/0314511 A1* | 12/2012 | Ishikawa | ............ | G01R 31/2884 365/189.05 |
| 2013/0153898 A1* | 6/2013 | Takahashi | ............... | H01L 22/32 257/48 |
| 2013/0221493 A1* | 8/2013 | Kim | ..................... | H01L 23/481 257/620 |

FOREIGN PATENT DOCUMENTS

KR  1020110076692 A  7/2011
KR  1020140024594 A  3/2014

* cited by examiner

*Primary Examiner* — Jermele M Hollington
*Assistant Examiner* — Suresh K Rajaputra
(74) *Attorney, Agent, or Firm* — William Park & Associates Ltd.

(57) ABSTRACT

An integrated circuit may include a first semiconductor device including a first through-silicon via configured for electrically coupling a first bump pad to a second bump pad, and may be configured to buffer a first internal test signal generated by a test signal inputted through the first bump pad and generate a first detection signal. The integrated circuit may include a second semiconductor device including a second through-silicon via configured for electrically coupling a third bump pad to a fourth bump pad, and may be configured to buffer a second internal test signal generated by the test signal inputted through the third bump pad and generate a second detection signal. The third bump pad may be electrically coupled with the second bump pad.

19 Claims, 5 Drawing Sheets

INTEGRATED CIRCUIT

CROSS-REFERENCE TO RELATED APPLICATION

The present application claims priority under 35 U.S.C. §119(a) to Korean application number 10-2014-0113493, filed on Aug. 28, 2014, in the Korean Intellectual Property Office, which is incorporated herein by reference in its entirety.

BACKGROUND

1. Technical Field

Embodiments of the present disclosure generally relate to an integrated circuit having a structure including a plurality of semiconductor devices that are stacked.

2. Related Art

Recently, as a packaging technology for an integrated circuit is rapidly developed, an integrated circuit, in which a plurality of semiconductor devices are stacked in a single package, has been suggested. The semiconductor devices stacked in the integrated circuit are formed with electrodes and through-silicon vias. Various internal signals and a variety of power may be transferred through the electrodes and the through-silicon vias.

Bump pads are used to supply the various internal signals and the different power among the plurality of semiconductor devices stacked in the integrated circuit. Such bump pads are designed to have a diameter of several tens of micrometers, for a high speed operation and high integration.

Because such bump pads with the size of several tens of micrometers are too small in size to be probed by the probe pins of test equipment, it is usually found that a semiconductor device is separately formed with probe pads having a size larger than the bump pads, so as to be tested.

SUMMARY

In an embodiment, an integrated circuit may include a first semiconductor device including a first through-silicon via configured for electrically coupling a first bump pad to a second bump pad. The first semiconductor device configured to buffer a first internal test signal generated by a test signal inputted through the first bump pad and configured to generate a first detection signal. The integrated circuit may include a second semiconductor device including a second through-silicon via configured for electrically coupling a third bump pad to a fourth bump pad. The second semiconductor device configured to buffer a second internal test signal generated by the test signal inputted through the third bump pad and configured to generate a second detection signal. The third bump pad may be electrically coupled with the second bump pad.

In an embodiment, an integrated circuit may include a first semiconductor device configured to output a first test signal through a first bump pad and output a second test signal through a second bump pad. The integrated circuit may include a second semiconductor device including a first through-silicon via configured for electrically coupling a third bump pad to a fourth bump pad. The second semiconductor device may include a second through-silicon via configured for electrically coupling a fifth bump pad to a sixth bump pad. The second semiconductor device may be configured to buffer a first internal test signal generated by the first test signal and generate a first detection signal. The second semiconductor device may be configured to buffer a second internal test signal generated by the second test signal and generate a second detection signal. The third bump pad being electrically coupled with the first bump pad and the fifth bump pad may be electrically coupled with the second bump pad.

DETAILED DESCRIPTION

Hereinafter, an integrated circuit will be described below with reference to the accompanying drawings through various examples of embodiments.

Various embodiments may be directed to an integrated circuit of a stacked structure, capable of testing electrical coupling states of bump pads and through-silicon vias.

According to the embodiments, advantages may be provided in that it may be possible to test electrical coupling states between bump pads and through-silicon vias included in semiconductor devices having a stacked structure.

Figure 1:
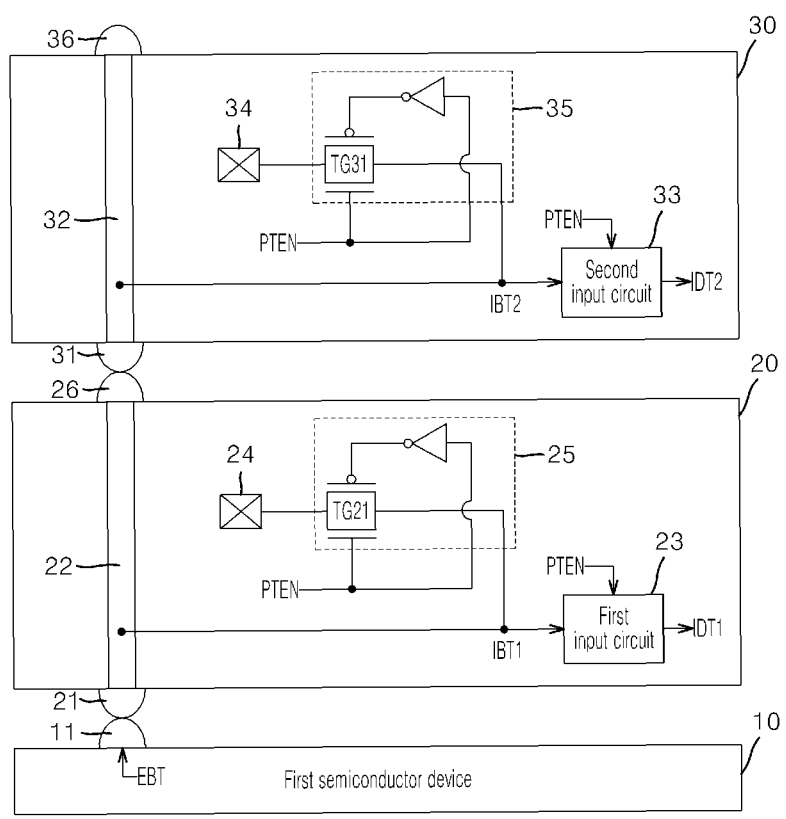
FIG. 1 is a block diagram illustrating a representation of an example of the configuration of an integrated circuit in accordance with an embodiment.

FIG. 1 is a block diagram illustrating a representation of an example of the configuration of an integrated circuit in accordance with an embodiment.

Referring to FIG. 1, the integrated circuit in accordance an embodiment may include a first semiconductor device 10, a second semiconductor device 20, and a third semiconductor device 30.

The first semiconductor device 10 may include a first bump pad 11. The first semiconductor device 10 may output a test signal EBT through the first bump pad 11. The first semiconductor device 10 may be configured to include a controller, a processor or a system for controlling a semiconductor device.

While it is illustrated that the first semiconductor device 10 is configured to include the first bump pad 11, it is to be noted that the first semiconductor device 10 may be realized to have a configuration that includes a plurality of bump pads. The first bump pad 11 may be configured to have a diameter of several tens of micrometers.

The second semiconductor device 20 may be configured with a first through-silicon via 22 electrically coupling a second bump pad 21 to a third bump pad 26. The second semiconductor device 20 may include a first input circuit 23 configured for buffering a first internal test signal IBT1 generated by the test signal EBT inputted through the second bump pad 21. The first input circuit 23 may generate a first detection signal IDT1. The second semiconductor device 20 may include a first switch unit 25 configured for electrically decoupling a first probe pad 24 from the first through-silicon via 22 as a transfer gate TG21 is turned off when a test enable signal PTEN is enabled to a logic low level. The first switch unit 25 may be configured to drive the first internal test signal IBT1 from the first through-silicon via 22 through the first probe pad 24 when the transfer gate TG21 is turned on when the test enable signal PTEN is disabled to a logic high level. The test enable signal PTEN may be a signal enabled in the example when entering a test mode for testing the electrical coupling states between a plurality of bump pads and a plurality of through-silicon vias and is received from outside the integrated circuit.

While it is illustrated that the second semiconductor device 20 is configured to include the second and third bump pads 21 and 26 and the first probe pad 24, it is to be noted that the second semiconductor device 20 may be realized to have a configuration that includes a plurality of bump pads and a plurality of probe pads. The second and third bump pads 21 and 26 may be realized to have a diameter of several tens of micrometers, and the first probe pad 24 may be realized to have a size allowing for the first probe pad 24 to be probed using the probe pin of test equipment.

The third semiconductor device 30 may be configured with a second through-silicon via 32 electrically coupling a fourth bump pad 31 to a fifth bump pad 36. The third semiconductor device 30 may include a second input circuit 33 configured for buffering a second internal test signal IBT2 generated by the test signal EBT inputted through the fourth bump pad 31. The second input circuit 33 may generate a second detection signal IDT2. The third semiconductor device 30 may include a second switch unit 35 configured for electrically decoupling a second probe pad 34 from the second through-silicon via 32 as a transfer gate TG31 is turned off when the test enable signal PTEN is enabled to the logic low level. The second switch unit 35 may be configured to drive the second internal test signal IBT2 from the second through-silicon via 32 through the second probe pad 34 as the transfer gate TG31 is turned on when the test enable signal PTEN is disabled to the logic high level.

While it is illustrated that the third semiconductor device 30 is configured to include the fourth and fifth bump pads 31 and 36 and the second probe pad 34, it is to be noted that the third semiconductor device 30 may be realized to have a configuration that includes a plurality of bump pads and a plurality of probe pads. The fourth and fifth bump pads 31 and 36 may be realized to have a diameter of several tens of micrometers, and the second probe pad 34 may be realized to have a size allowing for the second probe pad 34 to be probed using the probe pin of the test equipment. Although not illustrated in the drawing, the fifth bump pad 36 may be configured to be electrically coupled with a bump pad included in another semiconductor device.

Figure 2:
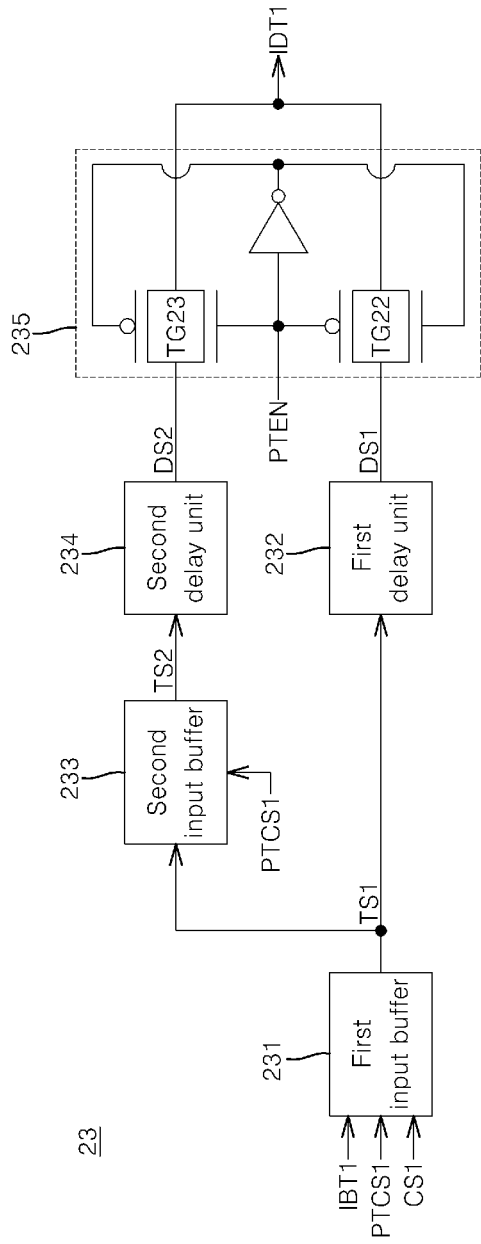
FIG. 2 is a block diagram illustrating a representation of an example of the configuration of the first input circuit included in the semiconductor device illustrated in FIG. 1.

Referring to FIG. 2, the first input circuit 23 included in the second semiconductor device 20 (see FIG. 1) may include a first input buffer 231, a first delay unit 232, and a second input buffer 233. The first input circuit 23 may include a second delay unit 234, and a first selective transfer unit 235.

The first input buffer 231 may buffer the first internal test signal IBT1 and may generate a first transfer signal TS1, in the example where a first probe select signal PTCS1 or a first select signal CS1 is enabled. The first probe select signal PTCS1 may be a signal received from outside the second semiconductor device 20 to drive the first internal test signal IBT1 from the first through-silicon via 22 through the first probe pad 24 (see FIG. 1). The first select signal CS1 may be a signal received from outside the second semiconductor device 20 to test the electrical coupling states between the bump pads 21 and 26 and the first through-silicon via 22 upon entry into the test mode.

The first delay unit 232 may buffer the first transfer signal TS1 and may generate a first delayed signal DS1. The first delay unit 232 may drive the first delayed signal DS1 with a driving force for securing the setup/hold time margins of the first delayed signal DS1. A setup time may be defined as, for example, a minimum amount of time for the logic level of the first delayed signal DS1 to transition before a time at which the first delayed signal DS1 is synchronized with a clock, in a synchronous semiconductor device. A hold time may be defined as, for example, a minimum amount of time for the logic level of the first delayed signal DS1 to be retained from the time at which the first delayed signal DS1 is synchronized with the clock.

The second input buffer 233 may buffer the first transfer signal TS1 and may generate a second transfer signal TS2, in the examples where the first probe select signal PTCS1 is enabled.

The second delay unit 234 may buffer the second transfer signal TS2 and may generate a second delayed signal DS2. The second delay unit 234 may be realized by the same circuit as the first delay unit 232, and may drive the second delayed signal DS2 with a driving force for securing the setup/hold time margins of the second delayed signal DS2.

The first selective transfer unit 235 may be configured by a transfer gate TG22 when turned on transfers the first delayed signal DS1 as the first detection signal IDT1 in the examples where the test enable signal PTEN is enabled to the logic low level. A transfer gate TG23 when turned on transfers the second delayed signal DS2 as the first detection signal IDT1 in the examples where the test enable signal PTEN is disabled to the logic high level. That is to say, the first selective transfer unit 235 may transfer the first delayed signal DS1 as the first detection signal IDT1 in the examples where the test enable signal PTEN is enabled, and transfers the second delayed signal DS2 as the first detection signal IDT1 in the examples where the test enable signal PTEN is disabled.

Since the second input circuit 33 included in the third semiconductor device 30 is realized by the same circuit and performs the same operation as the first input circuit 23 illustrated in FIG. 2 except that the signals inputted thereto and outputted therefrom are different, detailed descriptions thereof will be omitted herein.

Figure 3:
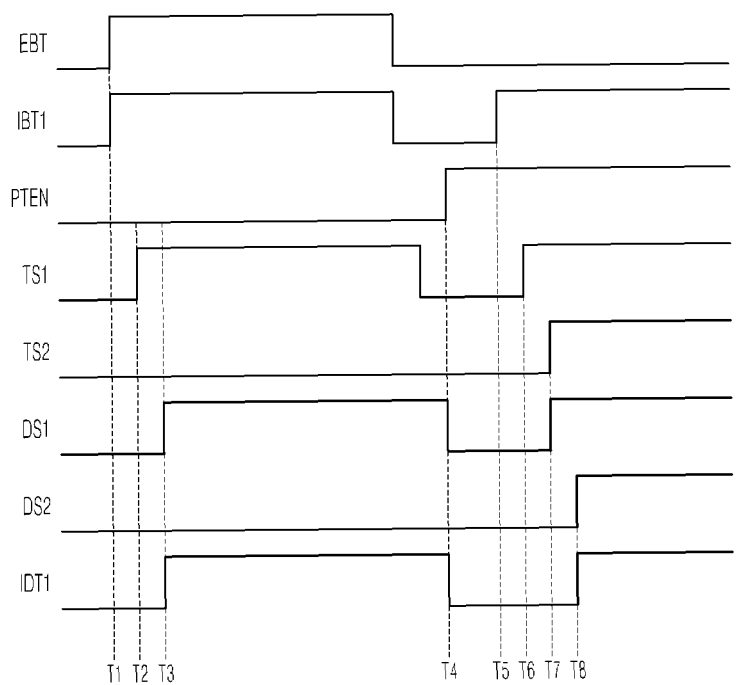
FIG. 3 is a representation of an example of a timing diagram to assist in the explanation of operations of the integrated circuit in accordance with the embodiments.

Operations of the second semiconductor device 20 as an example of the operations of the integrated circuit configured as mentioned above will be described below with reference to FIG. 3, by being divided into an operation for testing the electrical coupling states of a plurality of bump pads and a plurality of through-silicon vias by not using probe pads and an operation for testing the electrical coupling states of the plurality of bump pads and the plurality of through-silicon vias by using the probe pads.

First, the operations of the second semiconductor device 20 for testing the electrical coupling states of the plurality of bump pads and the plurality of through-silicon vias by not using the probe pads upon entry to the test mode will be described.

At a time T1, the first semiconductor device 10 may output the test signal EBT having a logic high level through the first bump pad 11.

The second semiconductor device 20 may be inputted with the test signal EBT through the second bump pad 21, generates the first internal test signal IBT1 of a logic high level, and outputs the test signal EBT through the first through-silicon via 22 and the third bump pad 26. The first switch unit 25 may be inputted with the test enable signal PTEN having a logic low level, and may electrically decouple the first probe pad 24 and the first through-silicon via 22.

At a time T2, the first input buffer 231 of the first input circuit 23 may buffer the first internal test signal IBT1 generated at the time T1, and may generate the first transfer signal TS1 having a logic high level. The second input buffer 233 may be inputted with the first probe select signal PTCS1 (not illustrated) which may be disabled, and thus, may not be driven.

At a time T3, the first delay unit 232 may buffer the first transfer signal TS1 generated at the time T2, and may generate the first delayed signal DS1 having a logic high level. The second delay unit 234 may buffer the second transfer signal TS2 generated at the time T2, and may generate the second delayed signal DS2 having a logic low level. The first selective transfer unit 235 may be inputted with the test enable signal PTEN having a logic low level, and may transfer the first delayed signal DS1 having the logic high level as the first detection signal IDT1.

Since the logic level of the test signal EBT is inputted having the logic high level and the logic level of the first detection signal IDT1 are the same, it may be seen that the electrical coupling states of the second and third bump pads 21 and 26 and the first through-silicon via 22 included in the second semiconductor device 20 are good or performing as intended. In the examples where the logic level of the test signal EBT is inputted having the logic high level and the logic level of the first detection signal IDT1 are different, it may be seen that the electrical coupling states of the second and third bump pads 21 and 26 and the first through-silicon via 22 included in the second semiconductor device 20 are not performing as intended, performing poorly, or bad.

Next, the operations of the second semiconductor device 20 for testing the electrical coupling states of the plurality of bump pads and the plurality of through-silicon vias by using the probe pads upon entry to the test mode will be described.

At a time T4, the first switch unit 25 is inputted with the test enable signal PTEN having a logic high level, and electrically couples the first probe pad 24 and the first through-silicon via 22.

At a time T5, since the first through-silicon via 22 is driven to a logic high level if the first probe pad 24 is driven to a logic high level, the first internal test signal IBT1 is generated to the logic high level.

At a time T6, the first input buffer 231 of the first input circuit 23 buffers the first internal test signal IBT1 having a logic high level generated at the time T5, and generates the first transfer signal TS1 having a logic high level.

At a time T7, the first delay section 232 buffers the first transfer signal TS1 generated at the time T6, and generates the first delayed signal DS1 having a logic high level. The second input buffer 233 is inputted with the first probe select signal PTCS1 which is enabled, buffers the first transfer signal TS1 generated at the time T6, and generates the second transfer signal TS2 having a logic high level.

At a time T8, the second delay unit 234 buffers the second transfer signal TS2 generated at the time T7, and generates the second delayed signal DS2 having a logic high level. The first selective transfer unit 235 is inputted with the test enable signal PTEN having a logic high level, and transfers the second delayed signal DS2 having a logic high level as the first detection signal IDT1.

Since the logic level of the first probe pad 24 driven to the logic high level and the logic level of the first detection signal IDT1 are the same, it may be seen that the electrical coupling states of the second and third bump pads 21 and 26 and the first through-silicon via 22 included in the second semiconductor device 20 are good or performing as intended. In the example where the logic level of the first probe pad 24 driven to the logic high level and the logic level of the first detection signal IDT1 are different, it may be seen that the electrical coupling states of the second and third bump pads 21 and 26 and the first through-silicon via 22 included in the second semiconductor device 20 are not performing as intended, performing poorly, or bad.

A method for testing the electrical coupling states of the second and third bump pads 21 and 26 included in the second semiconductor device 20 and the fourth and fifth bump pads 31 and 36 and the second through-silicon via 32 included in the third semiconductor device 30 by the first through-silicon via 22 driven to the logic high level may be easily performed by a person skilled in the art through referring to the above descriptions, and thus, detailed descriptions thereof will be omitted.

The integrated circuit according to an embodiment, configured as mentioned above, may test the electrical coupling states between the plurality of bump pads and the plurality of through-silicon vias included in semiconductor devices with a stacked structure.

Figure 4:
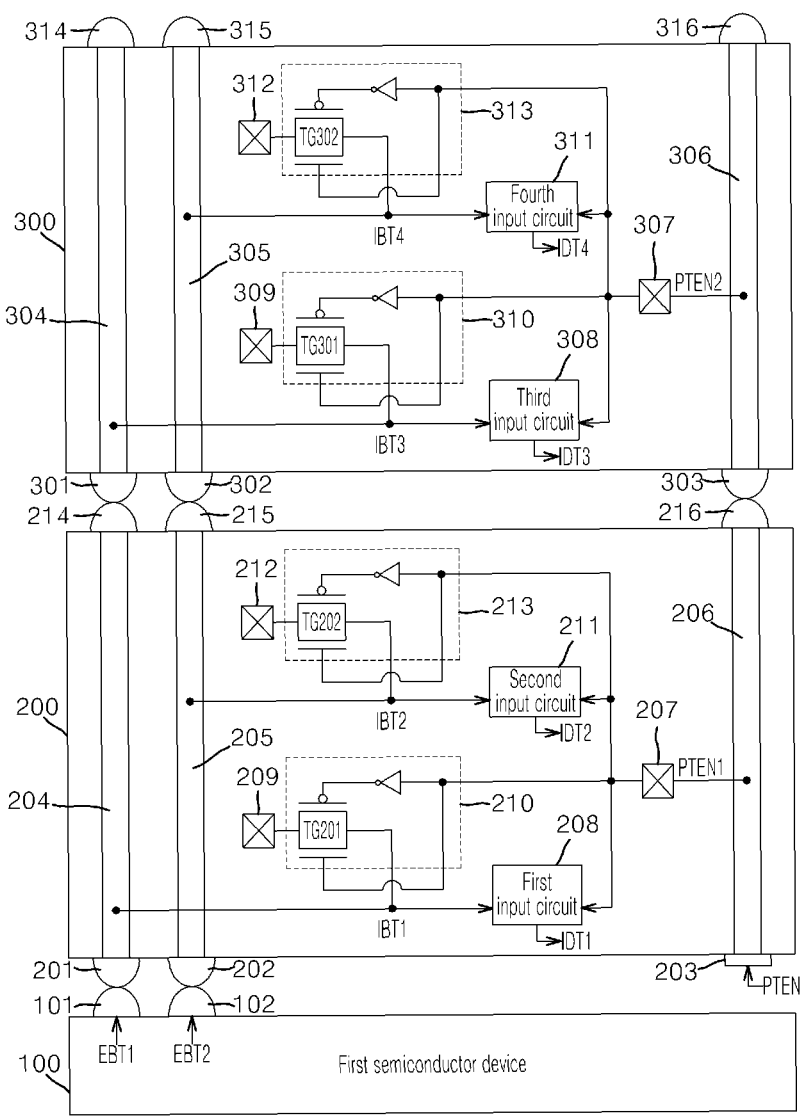
FIG. 4 is a block diagram illustrating a representation of an example of the configuration of an integrated circuit in accordance with an embodiment.

FIG. 4 is a block diagram illustrating a representation of an example of the configuration of an integrated circuit in accordance with an embodiment.

Referring to FIG. 4, the integrated circuit in accordance with an embodiment may include a first semiconductor device 100, a second semiconductor device 200, and a third semiconductor device 300.

The first semiconductor device 100 may include first and second bump pads 101 and 102. The first semiconductor device 100 may output a first test signal EBT1 through the first bump pad 101. The first semiconductor device 100 may output a second test signal EBT2 through the second bump 102. The first semiconductor device 100 may be configured by a controller, a processor or a system which controls a semiconductor device. The first and second bump pads 101 and 102 may be configured to have a diameter of several tens of micrometers.

The second semiconductor device 200 may be configured with a first through-silicon via 204. The first through-silicon via 204 may electrically couple a third bump pad 201 to a fourth bump pad 214. The second semiconductor device 200 may include a second through-silicon via 205. The second through-silicon via 205 may electrically couple a fifth bump pad 202 to a sixth bump pad 215. The second semiconductor device 200 may include a third through-silicon via 206. The third through-silicon via 206 may electrically couple an external pad 203 to a seventh bump pad 216. The second semiconductor device 200 may include a first internal pad 207 to which a first test enable signal PTEN1 generated by a test enable signal PTEN inputted through the external pad 203 may be applied. The second semiconductor device 200 may include a first input circuit 208. The first input circuit 208 may buffer a first internal test signal IBT1. The first internal test signal IBT1 may be generated by the first test signal EBT1 received through the third bump pad 201 and the first input circuit 208 may generate a first detection signal IDT1. The second semiconductor device 100 may include a first switch unit 210 configured for electrically decoupling a first probe pad 209 from the first through-silicon via 204 as a transfer gate TG201 is turned off when the first test enable signal PTEN1 is enabled to a logic low level. The first switch unit 210 is configured for driving the first test enable signal PTEN1 through the first through-silicon via 204 through the first probe pad 209 as the transfer gate TG201 is turned on when the first test enable signal PTEN1 is disabled to a logic high level. The second semiconductor device 100 may include a second input circuit 211. The second input circuit 211 may buffer a second internal test signal IBT2. The second internal test signal IBT2 may be generated by the second test signal EBT2 received through the fifth bump pad 202 and the second input circuit 211 may generate a second detection signal IDT2. The second semiconductor device 100 may include a second switch unit 213 configured for electrically decoupling a second probe pad 212 from the second through-silicon via 205 as a transfer gate TG202 is turned off when the first test enable signal PTEN1 is enabled to the logic low level. The second switch unit 213 is configured for driving the first test enable signal PTEN1 through the second through-silicon via 205 through the second probe pad 212 as the transfer gate TG202 is turned on when the first test enable signal PTEN1 is disabled to the logic high level. The test enable signal PTEN may be a signal which is enabled in the example of entering a test mode for testing the electrical coupling states between a plurality of bump pads and a plurality of through-silicon vias and is inputted through the external pad 203. The third to seventh bump pads 201, 214, 202, 215 and 216 may be configured to have a diameter of several tens of micrometers, and the first and second probe pads 209 and 212 may be configured to have a size to be probed using the probe pins of test equipment.

The third semiconductor device 300 may be configured with a fourth through-silicon via 304. The third semiconductor device 300 may electrically couple an eighth bump pad 301 to a ninth bump pad 314. The third semiconductor device 300 may include a fifth through-silicon via 305. The fifth through-silicon via 305 may electrically couple a tenth bump pad 302 to an eleventh bump pad 315. The third semiconductor device 300 may include a sixth through-silicon via 306. The sixth through-silicon via 306 may electrically couple a twelfth bump pad 303 to a thirteenth bump pad 316. The third semiconductor device 300 may include a second internal pad 307 to which a second test enable signal PTEN2 generated by the test enable signal PTEN inputted through the twelfth bump pad 303 may be applied. The third semiconductor device 300 may include a third input circuit 308. The third input circuit 308 may buffer a third internal test signal IBT3. The third internal test signal IBT3 may be generated by the first test signal EBT1 received through the eighth bump pad 301 and the third input circuit 308 may generate a third detection signal IDT3. The third semiconductor device 300 may include a third switch unit 310 configured for electrically decoupling a third probe pad 309 from the fourth through-silicon via 304 as a transfer gate TG301 is turned off when the second test enable signal PTEN2 is enabled to a logic low level. The third switch unit 310 is configured for driving the second test enable signal PTEN2 through the fourth through-silicon via 304 through the third probe pad 309 as the transfer gate TG301 is turned on when the second test enable signal PTEN2 is disabled to a logic high level. The third semiconductor device 300 may include a fourth input circuit 311. The fourth input circuit 311 may buffer a fourth internal test signal IBT4. The fourth internal test signal IBT4 may be generated by the second test signal EBT2 received through the tenth bump pad 302 and the fourth input circuit 311 may generate a fourth detection signal IDT4. The third semiconductor device 300 may include a fourth switch unit 313 configured for electrically decoupling a fourth probe pad 312 from the fifth through-silicon via 305 as a transfer gate TG302 is turned off when the second test enable signal PTEN2 is enabled to the logic low level. The fourth switch unit 313 is configured for driving the second test enable signal PTEN2 through the fifth through-silicon via 305 through the fourth probe pad 312 as the transfer gate TG302 is turned on when the second test enable signal PTEN2 is disabled to the logic high level. The eighth to thirteenth bump pads 301, 314, 302, 315, 303 and 316 may be configured to have a diameter of several tens of micrometers, and the third and fourth probe pads 309 and 312 may be configured to have a size to be probed using the probe pins of the test equipment. Although not illustrated in the drawing, the ninth bump pad 314, the eleventh bump pad 315 and the thirteenth bump pad 316 may be configured to be electrically coupled with bump pads which are included in another semiconductor device.

An operation for testing the electrical coupling states of a plurality of bump pads and a plurality of through-silicon vias by not using probe pads, as an example of operations of the integrated circuit configured as mentioned above, will be described below with reference to FIG. 4, by being divided into the examples where the electrical coupling states between the third bump pad 201 and the first through-silicon via 204 of the second semiconductor device 200 and between the fifth bump pad 202 and the second through-silicon via 205 of the second semiconductor device 200 are performing as intended or the connection is good and the examples where the electrical coupling state between the fifth bump pad 202 and the second through-silicon via 205 of the second semiconductor device 200 is not performing as intended, performing poorly, or bad.

First, the case where the electrical coupling states between the third bump pad 201 and the first through-silicon via 204 of the second semiconductor device 200 and between the fifth bump pad 202 and the second through-silicon via 205 of the second semiconductor device 200 are good or performing as intended will be described.

The first semiconductor device 100 may output the first test signal EBT1 of a logic high level through the first bump pad 101, and may output the second test signal EBT2 of a logic high level through the second bump pad 102.

The second semiconductor device 200 is inputted with the first test signal EBT1 through the third bump pad 201 and generates the first internal test signal IBT1 of a logic high level, and is inputted with the second test signal EBT2 through the fifth bump pad 202 and generates the second internal test signal IBT2 of a logic high level. The first test enable signal PTEN1, which is generated by being inputted with the test enable signal PTEN of the logic low level through the external pad 203, is applied to the first internal pad 207.

The first switch unit 210 is inputted with the first test enable signal PTEN1 of the logic low level and electrically decouples the first probe pad 209 and the first through-silicon via 204.

The first input circuit 208 buffers the first internal test signal IBT1 and generates the first detection signal IDT1 of a logic high level.

The second switch unit 213 is inputted with the first test enable signal PTEN1 of the logic low level and electrically decouples the second probe pad 212 and the second through-silicon via 205.

The second input circuit 211 buffers the second internal test signal IBT2 and generates the second detection signal IDT2 of a logic high level.

Since the logic level of the first test signal EBT1 inputted at the logic high level and the logic level of the first detection signal IDT1 are the same and the logic level of the second test signal EBT2 inputted at the logic high level and the logic level of the second detection signal IDT2 are the same, it may be that the electrical coupling states between the third bump pad 201 and the first through-silicon via 204 included in the second semiconductor device 200 and between the fifth bump pad 202 and the second through-silicon via 205 included in the second semiconductor device 200 are performing as intended or good.

Next, the example where the electrical coupling state between the fifth bump pad 202 and the second through-silicon via 205 of the second semiconductor device 200 is not performing as intended, performing poorly or is bad will be described.

The first semiconductor device 100 may output the first test signal EBT1 of the logic high level through the first bump pad 101, and may output the second test signal EBT2 of the logic high level through the second bump pad 102.

The second semiconductor device 200 is inputted with the first test signal EBT1 through the third bump pad 201 and generates the first internal test signal IBT1 of the logic high level, and is inputted with the second test signal EBT2 through the fifth bump pad 202 and generates the second internal test signal IBT2 of a logic low level. Since the electrical coupling state between the fifth bump pad 202 and the second through-silicon via 205 is not performing as intended, performing poorly, or bad and thus the second test signal EBT2 is not transferred, the second internal test signal IBT2 is generated to the logic low level. The first test enable signal PTEN1, which is generated by being inputted with the test enable signal PTEN of the logic low level through the external pad 203, is applied to the first internal pad 207.

The first switch unit 210 is inputted with the first test enable signal PTEN1 of the logic low level and electrically decouples the first probe pad 209 and the first through-silicon via 204.

The first input circuit 208 buffers the first internal test signal IBT1 and generates the first detection signal IDT1 of the logic high level.

The second switch unit 213 is inputted with the first test enable signal PTEN1 of the logic low level and electrically decouples the second probe pad 212 and the second through-silicon via 205.

The second input circuit 211 buffers the second internal test signal IBT2 and generates the second detection signal IDT2 having a logic low level.

Since the logic level of the second test signal EBT2 inputted at the logic high level and the logic level of the second detection signal IDT2 are different, it may be seen that the electrical coupling state between the fifth bump pad 202 and the second through-silicon via 205 included in the second semiconductor device 200 is bad or not performing as intended, performing poorly.

As is apparent from the above descriptions, in the integrated circuit according to the embodiments, configured as mentioned above, it may be possible to test electrical coupling states between a plurality of bump pads and a plurality of through-silicon vias included in semiconductor devices including a stacked structure.

Figure 5:
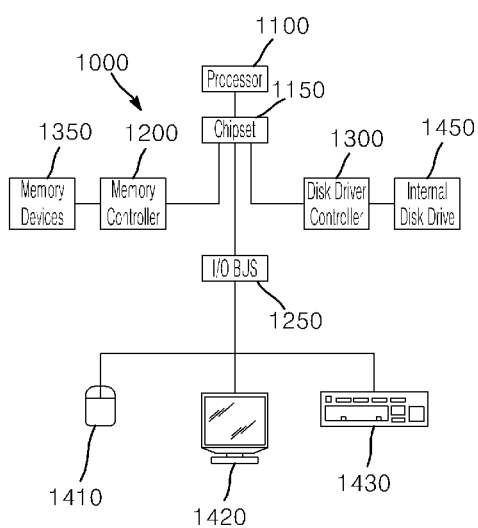
FIG. 5 illustrates a block diagram of an example of a representation of a system employing the integrated circuit in accordance with the embodiments discussed above with relation to FIGS. 1-4.

The integrated circuits discussed above (see FIGS. 1-4) are particular useful in the design of memory devices, processors, and computer systems. For example, referring to FIG. 5, a block diagram of a system employing the integrated circuits in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one integrated circuit as discussed above with reference to FIGS. 1-4. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one integrated circuit as discussed above with relation to FIGS. 1-4, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 5 is merely one example of a system employing the integrated circuit as discussed above with relation to FIGS. 1-4. In alternate embodiments, such as cellular phones or digital cameras, the components may differ from the embodiments illustrated in FIG. 5.

While various embodiments have been described above, it will be understood to those skilled in the art that the embodiments described are by way of example only. Accordingly, the integrated circuit described herein should not be limited based on the described embodiments.

What is claimed is:

1. An integrated circuit comprising:
   a first semiconductor device including a first probe pad, a first through-silicon via, the first through-silicon via configured for electrically coupling a first bump pad to a second bump pad; and
   a second semiconductor device including a second probe pad, a second through-silicon via, the second through-silicon via configured for electrically coupling a third bump pad to a fourth bump pad, and the third bump pad is electrically coupled with the second bump pad,
   wherein the first semiconductor device is configured to buffer a first internal test signal generated by a test signal received through the first bump pad and to generate a first detection signal, and the first semiconductor device electrically decouples the first probe pad from the first through-silicon via and tests electrical coupling states of the first bump pad, the second bump pad and the first through-silicon via while in a test mode, and
   wherein the second semiconductor device is configured to buffer a second internal test signal generated by the test signal received through the third bump pad and to generate a second detection signal, and the second semiconductor device electrically decouples the second probe pad from the second through-silicon via and tests electrical coupling states of the third bump pad, the fourth bump pad and the second through-silicon via while in the test mode.

2. The integrated circuit according to claim 1, wherein the test signal is a signal received from outside the first semiconductor device through the first bump pad when the integrated circuit enters a test mode.

3. The integrated circuit according to claim 1, wherein the first semiconductor device comprises:
   a first input circuit configured to buffer the first internal test signal in response to a test enable signal, and generate the first detection signal; and
   a first switch unit configured to electrically decouple the first probe pad from the first through-silicon via when the test enable signal is enabled.

4. The integrated circuit according to claim 3, wherein the test enable signal is a signal received from outside the integrated circuit when the integrated circuit enters a test mode for testing electrical coupling between a plurality of bump pads and a plurality of through-silicon vias.

5. The integrated circuit according to claim 3, wherein the first input circuit comprises:
   a first input buffer configured to buffer the first internal test signal in response to a first select signal and a first probe select signal, and generate a first transfer signal;
   a first delay unit configured to buffer the first transfer signal, and generate a first delayed signal;
   a second input buffer configured to buffer the first transfer signal in response to the first probe select signal, and generate a second transfer signal;
   a second delay unit configured to buffer the second transfer signal, and generate a second delayed signal; and
   a first selective transfer unit configured to transfer either the first delayed signal or the second delayed signal, as the first detection signal, in response to the test enable signal.

6. The integrated circuit according to claim 3, wherein the first switch unit drives the first internal test signal through the first through-silicon via and through the first probe pad when the test enable signal is disabled.

7. The integrated circuit according to claim 1, wherein the second semiconductor device comprises:
   a second input circuit configured to buffer the second internal test signal in response to the test enable signal, and generate the second detection signal; and
   a second switch unit configured to electrically decouple the second probe pad from the second through-silicon via when the test enable signal is enabled.

8. The integrated circuit according to claim 7, wherein the second input circuit comprises:
   a third input buffer configured to buffer the second internal test signal in response to a second select signal and a second probe select signal, and generate a third transfer signal;
   a third delay unit configured to buffer the third transfer signal, and generate a third delayed signal;
   a fourth input buffer configured to buffer the third transfer signal in response to the second probe select signal, and generate a fourth transfer signal;
   a fourth delay unit configured to buffer the fourth transfer signal, and generate a fourth delayed signal; and
   a second selective transfer unit configured to transfer either the third delayed signal or the fourth delayed signal, as the second detection signal, in response to the test enable signal.

9. The integrated circuit according to claim 7, wherein the second switch unit drives the second internal test signal through the second through-silicon via and through the second probe pad when the test enable signal is disabled.

10. An integrated circuit comprising:
    a first semiconductor device configured to output a first test signal through a first bump pad and output a second test signal through a second bump pad; and
    a second semiconductor device including:
       a first through-silicon via configured for electrically coupling a third bump pad to a fourth bump pad; and
       a second through-silicon via configured for electrically coupling a fifth bump pad to a sixth bump pad,
       the third bump pad is electrically coupled with the first bump pad, and the fifth bump pad is electrically coupled with the second bump pad,
    wherein the second semiconductor device is configured to buffer a first internal test signal generated by the first test signal and generate a first detection signal, the second semiconductor device electrically decouples a first probe pad from the first through-silicon via, the second semiconductor device configured to test electrical coupling states of the first bump pad, the third bump pad, the forth bump pad and the first through-silicon via while in a test mode, and
    wherein the second semiconductor device is configured to buffer a second internal test signal generated by the second test signal and generate a second detection signal, the second semiconductor device electrically decouples a second probe pad from the second through-silicon via, the second semiconductor device configured to test electrical coupling states of the second bump pad, the fifth bump pad, the sixth bump pad and the second through-silicon via while in the test mode.

11. The integrated circuit according to claim 10, wherein the second semiconductor device comprises:
    a first input circuit configured to buffer the first internal test signal in response to a first test enable signal generated by a test enable signal inputted through a third through-silicon via, and generate the first detection signal;

a first switch unit configured to electrically decouple the first probe pad from the first through-silicon via when the first test enable signal is enabled;

a second input circuit configured to buffer the second internal test signal in response to the first test enable signal, and generate the second detection signal; and a second switch unit configured to electrically decouple the second probe pad from the second through-silicon via when the first test enable signal is enabled, wherein the third through-silicon via is configured for electrically coupling an external pad to a seventh bump pad.

12. The integrated circuit according to claim 11, wherein the test enable signal is a signal received from outside the integrated circuit when the integrated circuit enters a test mode for testing electrical coupling between a plurality of bump pads and a plurality of through-silicon vias.

13. The integrated circuit according to claim 11, wherein the first switch unit drives the first internal test signal through the first through-silicon via and through the first probe pad when the first test enable signal is disabled.

14. The integrated circuit according to claim 11, wherein the second switch unit drives the second internal test signal through the second through-silicon via and through the second probe pad when the first test enable signal is disabled.

15. The integrated circuit according to claim 10, further comprising:

a third semiconductor device including:

a fourth through-silicon via configured for electrically coupling an eighth bump pad to a ninth bump pad; and a fifth through-silicon via configured for electrically coupling a tenth bump pad to an eleventh bump pad, wherein the third semiconductor device is configured to buffer a third internal test signal generated by the first test signal and generate a third detection signal, and buffer a fourth internal test signal generated by the second test signal and generate a fourth detection signal, wherein the eighth bump pad is electrically coupled with the fourth bump pad, and wherein the tenth bump pad is electrically coupled with the sixth bump pad.

16. The integrated circuit according to claim 15, wherein, in the test mode, the third semiconductor device electrically decouples a third probe pad from the fourth through-silicon via and electrically decouples a fourth probe pad from the fifth through-silicon via.

17. The integrated circuit according to claim 15, wherein the third semiconductor device comprises:

a third input circuit configured to buffer the third internal test signal in response to a second test enable signal generated by the test enable signal inputted through a sixth through-silicon via, and generate the third detection signal;

a third switch unit configured to electrically decouple the third probe pad from the fourth through-silicon via when the second test enable signal is enabled;

a fourth input circuit configured to buffer the fourth internal test signal in response to the second test enable signal, and generate the fourth detection signal; and a fourth switch unit configured to electrically decouple the fourth probe pad from the fifth through-silicon via when the second test enable signal is enabled, wherein the sixth through-silicon via is configured for electrically coupling a twelfth bump pad to the seventh bump pad and a thirteenth bump pad.

18. The integrated circuit according to claim 17, wherein the third switch unit drives the third internal test signal through the fourth through-silicon via and through the third probe pad when the second test enable signal is disabled.

19. The integrated circuit according to claim 17, wherein the fourth switch unit drives the fourth internal test signal through the fifth through-silicon via and through the fourth probe pad when the second test enable signal is disabled.

* * * * *